(12) United States Patent
Saito et al.

(10) Patent No.: US 10,490,736 B2
(45) Date of Patent: Nov. 26, 2019

(54) MAGNETIC MEMORY

(71) Applicant: KABUSHIKI KAISHA TOSHIBA, Minato-ku (JP)

(72) Inventors: Yoshiaki Saito, Kawasaki (JP); Tomoaki Inokuchi, Yokohama (JP); Yushi Kato, Chofu (JP); Soichi Oikawa, Hachioji (JP); Mizue Ishikawa, Yokohama (JP); Hiroaki Yoda, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 16 days.

(21) Appl. No.: 15/913,377

(22) Filed: Mar. 6, 2018

(65) Prior Publication Data

US 2019/0088860 A1   Mar. 21, 2019

(30) Foreign Application Priority Data

Sep. 15, 2017   (JP) .................................. 2017-178264

(51) Int. Cl.
*G11C 11/16* (2006.01)
*H01L 43/08* (2006.01)
(Continued)

(52) U.S. Cl.
CPC ............ *H01L 43/08* (2013.01); *G11C 11/161* (2013.01); *H01L 27/228* (2013.01); *H01L 43/02* (2013.01);
(Continued)

(58) Field of Classification Search
CPC ........... H01L 27/222–228; H01L 43/02; H01L 43/10; H01L 43/12; H01L 29/82; G11C 11/16; G11C 11/161; G11C 2211/5615
See application file for complete search history.

(56) References Cited

U.S. PATENT DOCUMENTS 9,076,537 B2   7/2015   Khvalkovskiy et al.
9,105,830 B2   8/2015   Khvalkovskiy et al.
(Continued)

FOREIGN PATENT DOCUMENTS

JP   2007-35139    2/2007
JP   2014-45196    3/2014
(Continued)

OTHER PUBLICATIONS

P. Laczkowski, et al. "AM-01. Large and tunable spin Hall angles in gold based alloys: from intrinsic to side jump contributions", Intermag2017, Spintec, 1 page.
(Continued)

*Primary Examiner* — Selim U Ahmed
*Assistant Examiner* — Evan G Clinton
(74) *Attorney, Agent, or Firm* — Oblon, McClelland, Maier & Neustadt, L.L.P.

(57) ABSTRACT

A magnetic memory according to an embodiment includes: first to third terminals; a nonmagnetic conductive layer including first to third regions, the second region being disposed between the first and third regions, the first region being electrically connected to the first terminal, and the third region being electrically connected to the second terminal; and a magnetoresistive element disposed to correspond to the second region, including a first magnetic layer electrically connected to the third terminal, a second magnetic layer disposed between the first magnetic layer and the second region, and a nonmagnetic layer disposed between the first and second magnetic layers, the conductive layer including at least one of an alloy including Ir and Ta, an alloy including Ir and V, an alloy including Au and V, an alloy including Au and Nb, or an alloy including Pt and V, each of the alloys having an fcc structure.

17 Claims, 10 Drawing Sheets

(51) Int. Cl.
  *H01L 43/02*   (2006.01)
  *H01L 43/10*   (2006.01)
  *H01L 27/22*   (2006.01)

(52) U.S. Cl.
  CPC .......... *H01L 43/10* (2013.01); *G11C 11/1673* (2013.01); *G11C 11/1675* (2013.01)

(56) References Cited

U.S. PATENT DOCUMENTS

| | | | |
|---|---|---|---|
| 9,755,140 B2* | 9/2017 | Lim | ........................ H01L 43/08 |
| 9,881,660 B2 | 1/2018 | Yoda et al. | |
| 2007/0026260 A1 | 2/2007 | Nemoto et al. | |
| 2015/0200003 A1* | 7/2015 | Buhrman | ................ G11C 11/18 |
| | | | 365/158 |
| 2017/0077394 A1 | 3/2017 | Saida | |

FOREIGN PATENT DOCUMENTS

| | | |
|---|---|---|
| JP | 5545532 | 7/2014 |
| JP | 2017-59690 | 3/2017 |

OTHER PUBLICATIONS

Kai-Uwe Demasius, et al. "Enhanced spin-orbit torques by oxygen incorporation in tungsten films", Nature Comm., DOI: 10.1038/ncomms10644, 2016, 7 pages.
M. Oba, et al. "Electric-Field-Induced Modification of the Magnon Energy, Exchange Interaction, and Curie Temperature of Transition-Metal Thin Films", PRL 114, 107202, 2015, 5 pages.
Martin Gradhand, et al. "Extrinsic Spin Hall Effect from First Principles", PRL 104, 186403, 2010, 4 pages.
Martin Gradhand, et al. "Spin Hall angle versus spin diffusion length: Tailored by impurities", PRB 81, 245109, 2010, 5 pages.

* cited by examiner

MAGNETIC MEMORY

CROSS REFERENCE TO RELATED APPLICATIONS

This application is based upon and claims the benefit of priority from the prior Japanese Patent Application No. 2017-178264, filed on Sep. 15, 2017, the entire contents of which are incorporated herein by reference.

FIELD

Embodiments described herein relate generally to magnetic memories.

BACKGROUND

Recently, research and development of magnetic memories (magnetic random access memories (SOT-MRAMs)) that perform spin orbit torque (SOT) write operations has been actively performed. A memory element included in an SOT-MRAM has a structure in which magnetic tunnel junction (MTJ) elements each having a multilayer structure including a storage layer, a nonmagnetic layer, and a reference layer are disposed on a conductive nonmagnetic layers (also called "SO layers"). The magnetization direction of each storage layer is switched by causing a current to flow through the conductive nonmagnetic layer. A read operation is performed by causing a read current to flow between the conductive nonmagnetic layer and the reference layer through the storage layer and the nonmagnetic layer.

Magnetic memories that perform a write operation using spin transfer torque (STT) are also known (STT-MRAMs). A memory element of an STT-MRAM includes MTJ elements each having a multilayer structure including a storage layer, a nonmagnetic layer, and a reference layer. The magnetization direction of the storage layer is switched by causing a write current to flow between the storage layer and the reference layer via the nonmagnetic layer. A read operation is performed by causing a read current to flow between the storage layer and the reference layer via the nonmagnetic layer.

Since the read current path and the write current path are the same in the STT-MRAM, the element characteristics may vary if the device is miniaturized. Therefore, it is difficult to have enough margins among the read current, the write current, the current of the transistor connected to the MTJ element for selecting the MTJ element, and the breakdown current of the MTJ element by reducing the variations in the respective currents.

In the SOT-MRAM, the read current path is different from the write current path. Therefore margins to deal with the variations in the respective currents are relatively large. Thus, variations of the read current, the current of the transistor connected to the MTJ element for selecting the MTJ element, the breakdown current that may breaks the nonmagnetic layer of the MTJ element, the write current, and the electromigration current flowing through the SO layer may be allowed to some extent. The SOT-M RAM thus may have relatively broad margins to deal with variations in currents even if the memory elements are miniaturized (to improve the capacity of the memory). This is an advantage of the SOT-MRAM to the STT-MRAM.

However, the cell area of the SOT-MRAM including the memory elements is as large as 12 $F^2$, F being the minimum feature size, and the write efficiency ($=\Delta/Ic$) of the SOT-MRAM is about 0.3, which is not so good. Thus, the SOT-MRAM is inferior in the cell area and the write efficiency to the STT-MRAM. These problems need to be solved.

An SOT-MRAM is known, which has a reduced cell area. The SOT-MRAM includes a memory cell in which a string of MTJ elements (memory elements) is disposed on an SO layer. The cell area of the SOT-MRAM with such a structure is reduced to 6.75 $F^2$ per one bit (one memory element), which enables to produce a large-capacity voltage-controlled magnetic memory. In order to employ this structure, however, a voltage assisted magnetic anisotropy control technique, which changes the magnetic anisotropy (coercive force) of the storage layer by applying a voltage to the MTJ element, is preferably used in the SOT write operation.

DETAILED DESCRIPTION

How the present invention has been conceived is first described before embodiments of the present invention are described.

As described above, the SOT-MRAM is inferior in write efficiency to the STT-MRAM, and needs to improve the write efficiency. The write efficiency is defined by dividing thermal stability $\Delta$ ($=E/kT$) by average write current Ic ($=\Delta/Ic$), where E is the height of energy barrier when the spin of the storage layer is parallel and antiparallel to the spin of the reference layer, Ic is an average value of the currents Ip and Tap (($Ia+Ip$)/2) in a case where the spin of the storage layer is changed from a parallel state to an antiparallel state and a case where the spin is changed from an antiparallel state to a parallel state. The write efficiency of the SOT-MRAM needs to be improved.

Figure 1:
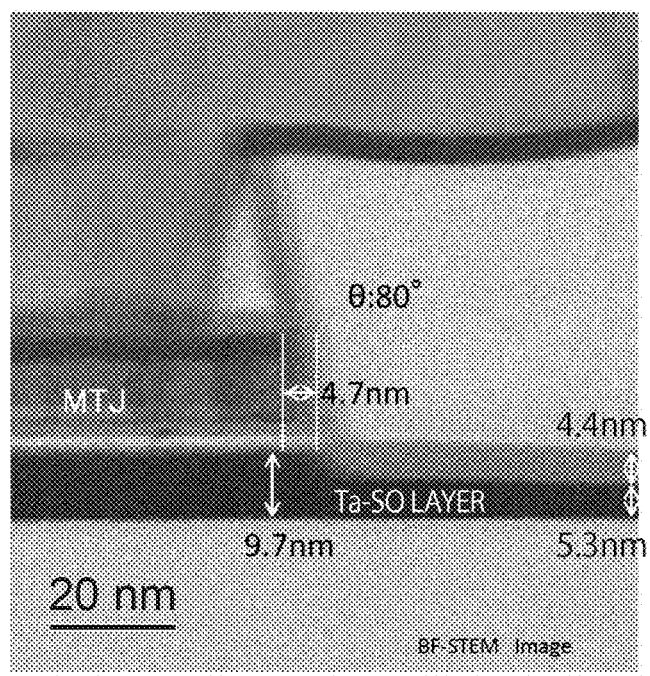
FIG. 1 is a photograph for explaining a problem of a memory cell included in an SOT-MRAM.

FIG. 1 is a photograph of a cross-section around an MTJ element of a memory cell included in an SOT-MRAM that is actually fabricated, taken by a transmission electron microscope (TEM). The MTJ element included in the memory cell is disposed on a conductive layer (SO layer) of Ta having a thickness of 9.7 nm. As can be understood from FIG. 1, the surface of the conductive layer is oxidized in a region other than a region immediately below the MTJ element, where the conductive layer and an interlayer insulating film are in contact with each other, and the thickness of the region is reduced from 9.7 nm to 5.3 nm. The thickness of the oxidized portion of the layer thus is 4.4 (=9.7−5.3) nm.

Figure 2:
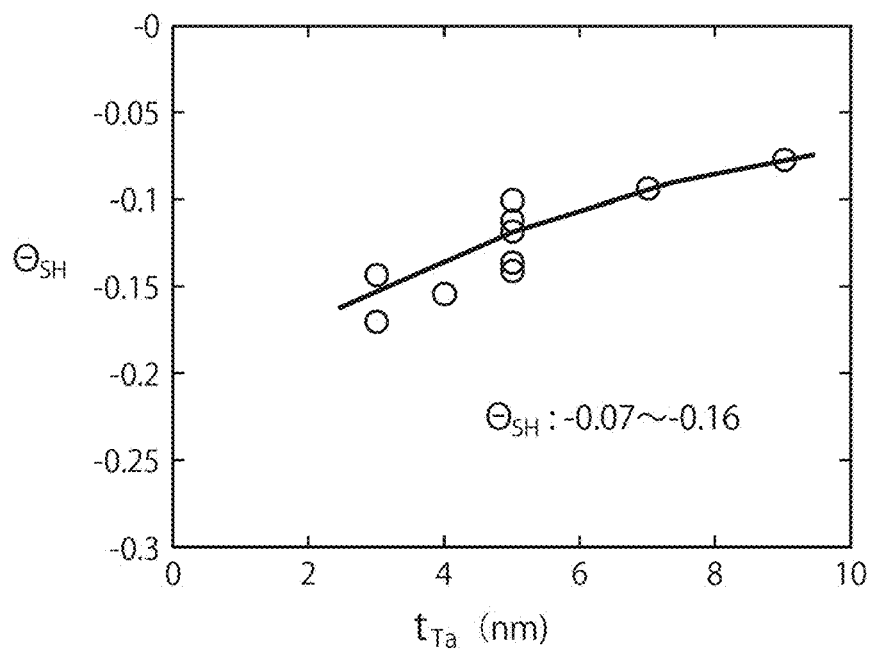
FIG. 2 is a graph showing the dependency of the spin Hall angle to the thickness of the conductive layer.

FIG. 2 shows the result of measurements proving the dependency of the spin Hall angle $\theta_{SH}$ to the thickness of a conductive layer including a nonmagnetic heavy metal element. The conductive layer of the measurements shown in FIG. 2 includes β-Ta. The write current density Jc (=Ic/cross-sectional area of SO layer) is proportional to the absolute value of the spin Hall angle $\theta_{SH}$.

$$Jc = k \cdot |\theta_{SH}|$$

Where k denotes a proportional constant. Therefore, if the thickness $t_{Ta}$ of the SO layer is reduced from 10 nm to 6 nm, for example, the average value of the write current $I_c$ is reduced to 1/2.8. Thus, in order to reduce the write current, the thickness of the conductive layer may need to be reduced. However, as described above with reference to FIG. 1, if the thickness of the conductive layer is reduced to 6 nm, the thickness of the region in the conductive layer other than the region where the MTJ element is formed is reduced to 1.6 (=6−4.4) nm. This increases the resistance of the conductive layer, and the function as an electrode may be lost.

Figure 3:
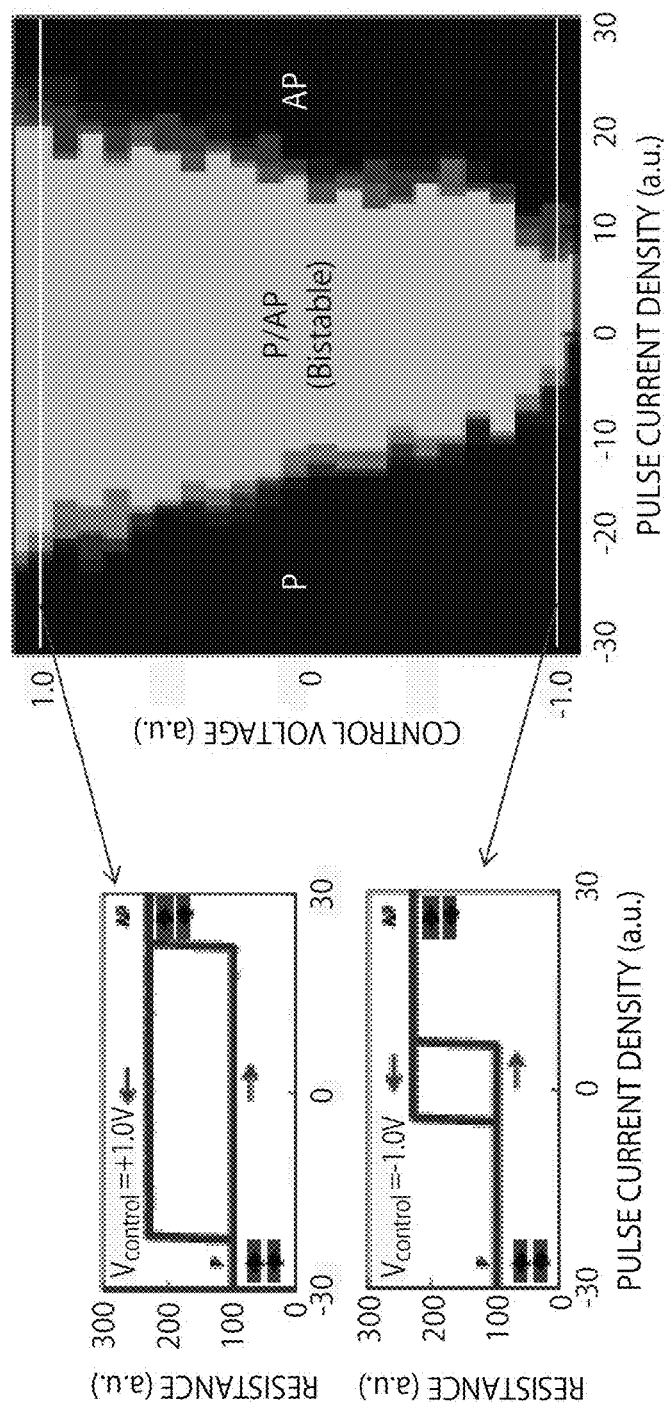
FIGS. 3A to 3C are a diagram showing the changes in SOT switching current density when the voltage anisotropy effect is used.

There is another problem. A voltage assisted magnetic anisotropy control technique is used for controlling an SOT-MRAM including a memory cell in which a string of MTJ elements is disposed on an SO layer. A characteristic of the voltage assisted magnetic anisotropy control technique is shown in FIGS. 3A to 3C. If a voltage of +1 V is applied to an MTJ element of the SOT-MRAM, the current density in the SO layer required to switch the magnetization of the storage layer of the MTJ element increases (FIGS. 3A and 3C), and if a voltage of −1 V is applied to the MTJ element, the current density in the SO layer required to switch the magnetization of the storage layer of the MTJ element decreases (FIGS. 3B and 3C). In this architecture of SOT-MRAM, the memory elements (MTJ elements) may be arranged with a high density, and a write operation may be simultaneously performed with a voltage of one pulse applied to the memory elements to switch the magnetization of the storage layer of the MTJ element. Therefore, the power consumption may be reduced. However, if a difference in write current density between a selected memory element and a non-selected memory element is smaller than variations in write current density among the memory elements, a write disturb error (WDE) may be caused. Although a voltage of ±1 V is applied to the MTJ element in the above description, the voltage of ±1 V is too much for an MTJ element having very thin films, and may cause a breakdown of the tunnel barrier. In other words, reliability of the MTJ becomes lower.

As described above, in order to reduce the write current, a material having a large spin Hall angle $\theta_{SH}$ is preferably used. Known examples of such a material are Ta, W, Re, Os, Ir, Pt, Au, Ag, alloys of these materials, and Cu—Bi. If a β-W film is formed in the noble gas Ar with oxygen ($O_2$), a maximum value at present $\theta_{SH}$=−0.5 may be obtained (Nature Comm. DOI:10.1038/ncomms10644). According to a recent report, the spin Hall angle $\theta_{SH}$ of about 0.5 is obtained by $Au_{0.9}Ta_{0.1}$ (Au with 10% of Ta) having a thickness of 10 nm (Intermag2017AM-01 by Spintec (Fert, Jaffres)).

The inventors of the present invention have studied hard to invent a magnetic memory with good write efficiency, which is obtained by using the voltage assisted magnetic anisotropy control technique. Embodiments of such a magnetic memory will be described below.

A magnetic memory according to an embodiment includes: a first terminal, a second terminal, and a third terminal; a nonmagnetic conductive layer including a first region, a second region, and a third region, the second region being disposed between the first region and the third region, the first region being electrically connected to the first terminal, and the third region being electrically connected to the second terminal; and a magnetoresistive element disposed to correspond to the second region, including a first magnetic layer electrically connected to the third terminal, a second magnetic layer disposed between the first magnetic layer and the second region, and a nonmagnetic layer disposed between the first magnetic layer and the second magnetic layer, the conductive layer including at least one of an alloy including Ir and Ta, an alloy including Ir and V, an alloy including Au and V, an alloy including Au and Nb, or an alloy including Pt and V, each of the alloys having an fcc structure.

(First Embodiment)

Figure 4:
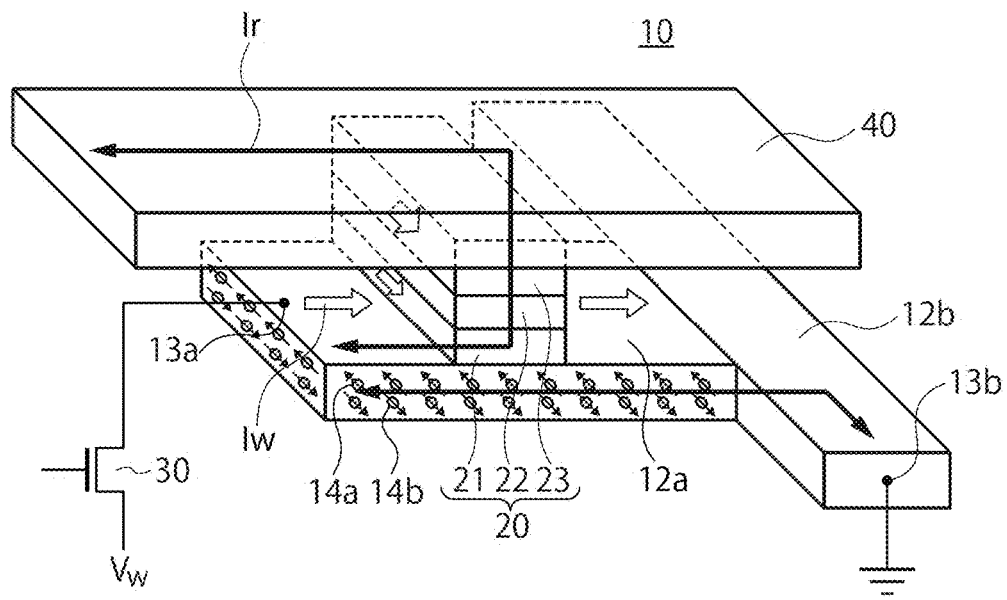
FIG. 4 is a perspective view of a memory cell included in a magnetic memory according to a first embodiment.

A magnetic memory according to a first embodiment will be described with reference to FIG. 4. The magnetic memory according to the first embodiment is an SOT-MRAM including at least one memory cell. FIG. 4 shows such a memory cell 10. The memory cell 10 includes nonmagnetic conductive layers (SO layers) 12a and 12b, a magnetoresistive element (for example, an MTJ element) 20 disposed on the conductive layer 12a, which serves as a memory element, a switching element 30, and a wiring line 40. The conductive layer 12b is connected to the conductive layer 12a. The conductive layer 12a has a terminal (first terminal) 13a, and the conductive layer 12b has a terminal (second terminal) 13b. The conductive layer 12b may be eliminated. In such a case, the terminal 13b is provided to the conductive layer 12a, and the MTJ element 20 is disposed in a region of the conductive layer 12a between the terminal 13a and the terminal 13b. The conductive layers 12a and 12b are conductive nonmagnetic layers, which generate a spin current when a current flows through them, to apply a spin obit torque (SOT) to a storage layer of the magnetoresistive element. Thus, the conductive layer 12a is a conductive nonmagnetic layer having a spin orbit coupling function. Although a transistor is illustrated as the switching element 30 in FIG. 4, any switching element other than a transistor, which is turned on or off based on a control signal, may be used.

The magnetoresistive element 20 includes a storage layer (second magnetic layer) 21, in which the magnetization direction may be changed, a reference layer (first magnetic layer) 23, in which the magnetization direction is fixed, and a nonmagnetic layer (first nonmagnetic layer) 22 disposed between the storage layer 21 and the reference layer 23. The state "the magnetization direction may be changed" means that, after a write operation is performed, the magnetization direction may be changed, and the state "the magnetization direction is fixed" means that, after a write operation is performed, the magnetization direction is not changed. The storage layer 21 is connected to the conductive layer 12a, and the reference layer 23 is connected to the wiring line 40. One (terminal) of the source and the drain of the transistor 30 is connected to the terminal 13a of the conductive layer 12a. The other (terminal) of the source and the drain and the gate (control terminal) of the transistor 30 are connected to a control circuit, which is not shown. The terminal 13b of the conductive layer 12b is grounded as shown in FIG. 4, or connected to the control circuit. The control circuit is also connected to the wiring line 40.

In this SOT-MRAM, a write operation is performed by causing, by means of the transistor 30, a write current $I_w$ to flow through the conductive layers 12a and 12b between the terminal 13a and the terminal 13b, and a read operation is performed by causing, by means of the transistor 30, a read current $I_r$ to flow through the terminal 13a, the conductive layer 12a, the magnetoresistive element 20, and the wiring line 40. Thus, the write current path and the read current path are different from each other.

When the write current $I_W$ flows through the conductive layer 12a in the write operation, spin-polarized electrons 14a with one of up spin and down spin flow to the top surface side of the conductive layer 12a and spin-polarized electrons 14b with the other flow to the lower surface side of the conductive layer 12a. This generates a spin current that applies a spin torque to the storage layer 21 of the magnetoresistive element 20 to switch the magnetization direction of the storage layer 21. Alternatively, a voltage may be applied, in the write operation, to the reference layer 23 of the magnetoresistive element 20 via a transistor that is not shown, as in a third embodiment that is described later. The applied voltage changes the uniaxial magnetic anisotropy of the storage layer 21 in the MTJ element 20 to enable the magnetization of the storage layer 21 to switch easily.

The conductive layers 12a and 12b of the magnetic memory according to the first embodiment include an alloy having a face-centered cubic (fcc) structure. The alloy is at least one selected from Ir—Ta, Ir—V, Au—V, Au—Nb, or Pt—V, or at least two of the above alloys selected and combined. As used herein, a phrase referring to "at least one of" a list of items refers to any combination of those items, including a single member. As an example, "at least one of: a, b, or c" is intended to cover a, b, c, a-b, a-c, b-c, and a-b-c." The alloy Ir—Ta, for example, means an alloy including Ir and Ta. The expression "IrTa" also means an alloy including Ir and Ta.

The material with the fcc structure improves the voltage assisted magnetic anisotropy control effect, and also the spin Hall angle of the conductive layer. Therefore, if such a material is used to form the conductive layer, and also the storage layer 21 (i.e., if both the conductive layer and the storage layer 21 are formed of a magnetic material having the same Δ), the switching current Ic may be reduced as compared to the case where another material is used for the conductive layer.

The reduction in switching current is observed for such materials as $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), and $Pt_{1-x}V_x$ (x is from 0.05 to 0.35). The materials $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), and $Pt_{1-x}V_x$ (x is from 0.05 to 0.35) preferably have the fcc structure.

As described above, the magnetic memory according to the first embodiment improves the write efficiency.

(Modification)

A modification of the magnetic memory according to the first embodiment will be described with reference to FIG. 5.

Figure 5:
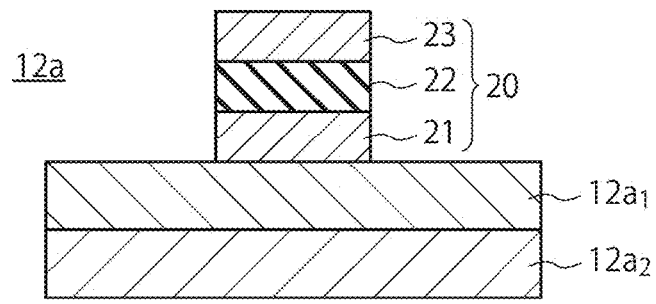
FIG. 5 is a cross-sectional view of a memory cell included in a magnetic memory according to a modification of the first embodiment.

The magnetic memory according to the modification has the same structure as the magnetic memory according to the first embodiment shown in FIG. 4 except that the conductive layer 12a has a multilayer structure including a conductive layer $12a_1$ and a conductive layer $12a_2$ (FIG. 5). The MTJ element 20 is disposed on the conductive layer $12a_1$. Like the first embodiment, if the conductive layer $12a_1$ includes $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35), the reduction in switching current is observed. The material may be one of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), and $Pt_{1-x}V_x$ (x is from 0.05 to 0.35), or two or more of these alloys that are combined.

A sample is prepared, in which an in-plane magnetization MTJ element 20 having a structure CoFeB (2 nm)/MgO (1.5 nm)/CoFeB (1.2 nm)/Co (0.6 nm)/Ru (0.9 nm)/CoFe (1.8 nm)/IrMn (8 nm)/Ta (5 nm) is disposed on the conductive layer 12a having a two-layer structure including a Ta layer $12a_2$ having a thickness of 5 nm and a $Ir_{90}Ta_{10}$ layer $12a_1$ having a thickness of t nm. The storage layer 21 of the MTJ element 20 is the CoFeB layer having a thickness of 2 nm, the nonmagnetic insulating layer 22 is the MgO layer having a thickness of 1.5 nm, and the reference layer 23 has a multilayer structure including the CoFeB layer having a thickness of 1.2 nm, the Co layer having a thickness of 0.6 nm, the Ru layer having a thickness of 0.9 nm, and the CoFe layer having a thickness of 1.8 nm. The IrMn layer having a thickness of 8 nm is disposed on the reference layer 23, and the Ta layer having a thickness of 5 nm is disposed on the IrMn layer.

Figure 6:
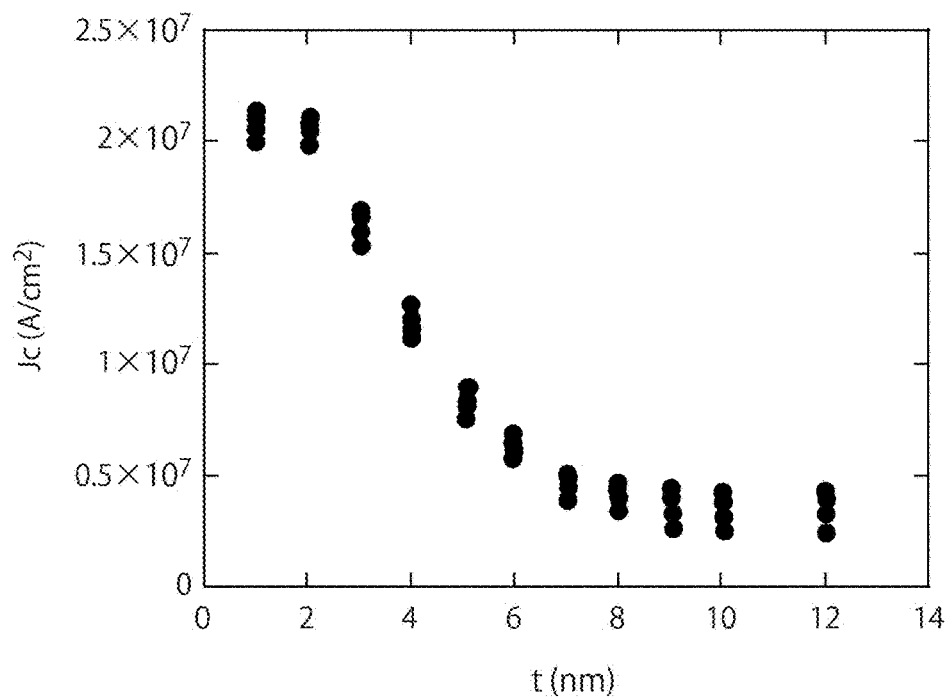
FIG. 6 is a diagram showing the dependency of the write current density to the thickness of the $Ir_{90}Ta_{10}$ layer.

FIG. 6 shows the result of measurements of switching current density Jc relating to an SOT current for switching the magnetization of the storage layer 21 included in the MTJ element 20 of the sample, when the thickness t (nm) of the $Ir_{90}Ta_{10}$ layer $12a_1$ is changed in a range from 1 nm to 12 nm. As can be understood from FIG. 6, the switching current density Jc decreases if the thickness t of the $Ir_{90}Ta_{10}$ layer is greater than 3 nm, and further decreases if the thickness is greater than 5 nm.

The decrease in the switching current can also be observed when the material of the conductive layer $12a_1$ is $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35). The tendency shown in FIG. 6 may also be observed when a material obtained by combining at least two of the above alloy is used for the conductive layer 12a.

The magnetic memory according to the modification also decreases the write current and the power consumption. Furthermore, the magnetic memory according to the modification improves the write efficiency, like the first embodiment.

(Magnetic Material)

The magnetic materials of the storage layer 21 and the reference layer 23 in the first embodiment and its modification are not limited, but preferably at least one selected from Ni—Fe alloy, Co—Fe alloy, Co—Fe—Ni alloy, an amorphous material such as (Co, Fe)—(B), (Co, Fe, Ni)—(B), (Co, Fe, Ni)—(B)—(P, Al, Mo, Nb, Mn) or Co—(Zr, Hf, Nb, Ta, Ti), or a Heusler material such as Co—Fe—Al, Co—Fe—Si, Co—Mn—Si, or Co—Mn—Al. More preferably, the storage layer 21 and the reference layer 23 have a multilayer structure.

If the memory elements are densely disposed with intervals of 30 nm or less, the storage layer 21 preferably has a multilayer structure.

If the spin of the magnetic layer is parallel to the film plane (for example, the top surface of the multilayer structure), the multilayer structure preferably is CoFe(B)/nonmagnetic metal (one of Cu, Ag, and Au)/CoFe(B), Fe(CoB)/Cr/Fe(CoB), Mn-based Heusler alloy/MgO/Mn-based Heusler alloy, or fcc magnetic layer/nonmagnetic metal (Ru or Ir)/fcc magnetic layer/(Ta, W, Mo)/CoFeB. The expression CoFe(B) means that B (boron) may be included, therefore CoFeB or CoFe. Similarly, Fe(CoB) means Fe or FeCoB. The expression (Ta, W, Mo) means at least one of Ta, W, or Mo is included.

If the spin of the magnetic layer is perpendicular to the film plane, the multilayer structure preferably is Co(Fe)(B)/Pt/Co(Fe)(B), Co(Fe)(B)/Pd/Co(Fe)(B), Co(Fe)(B)/Ni/Co(Fe)(B), (Co/Pt)n/Ru, or Ir/(Co/Pt)m (with CoFeB disposed at the interface with the tunnel insulating layer), or fcc magnetic layer/nonmagnetic metal (Ru or Ir)/fcc magnetic layer/(Ta, W, Mo)/CoFeB.

The reference layer 23 preferably has one-directional magnetic anisotropy, and the storage layer 21 preferably has uniaxial magnetic anisotropy. The thickness of these layers is preferably from 0.1 nm to 10 nm. These magnetic layers need to be thick enough not to enter the superparamagnetic state, and therefore preferably have a thickness of 0.4 nm or more.

The magnetic characteristics of the aforementioned magnetic materials may be adjusted by adding thereto a nonmagnetic element such as silver (Ag), copper (Cu), gold (Au), aluminum (Al), magnesium (Mg), silicon (Si), bismuth (Bi), tantalum (Ta), boron (B), carbon (C), oxygen (O), nitrogen (N), palladium (Pd), platinum (Pt), zirconium (Zr), iridium (Ir), tungsten (W), molybdenum (Mo), or niobium (Nb). Other physical characteristics such as crystallinity, the mechanical characteristics, and the chemical characteristics may be adjusted by the addition of the nonmagnetic element.

The magnetic layer that is close to the tunnel insulating layer 22 in MTJ element 20 preferably includes a material having a large magnetic resistance (MR) such as Co—Fe, Co—Fe—Ni, or Fe-rich Ni—Fe, and the magnetic layer that is not in contact with the tunnel insulating layer preferably includes an amorphous material such as Ni-rich Ni—Fe, Ni-rich Ni—Fe—Co, or CoFeB to curb variations in switching current with the large MR being maintained.

The material of the reference layer 23 is not limited as long as the magnetization is stably fixed.

Specifically, the magnetization may be fixed in one direction if the magnetic layer has a three-layer structure such as Co(Co—Fe)/Ru (ruthenium)/Co(Co—Fe), Co(Co—Fe)/Rh (rhodium)/Co(Co—Fe), Co(Co—Fe)/Ir (iridium)/Co(Co—Fe), Co(Co—Fe)/Os (osmium)/Co(Co—Fe), Co(Co—Fe)/Re (rhenium)/Co(Co—Fe), amorphous material layer such as Co—Fe—B/Ru (ruthenium)/Co—Fe, amorphous material layer such as Co—Fe—B/Ir (iridium)/Co—Fe, amorphous material layer such as Co—Fe—B/Os(osmium)/Co—Fe, amorphous material layer such as Co—Fe—B/Re (rhenium)/Co—Fe, (Co/Pt)n/Ru/(Co/Pt)m/CoFeB (n and m each indicate the number of stacked layers), (Co/Pt) n/Ir/(Co/Pt)m/CoFeB, (Co/Pt)n/Re/(Co/Pt)m/CoFeB, or (Co/Pt)n/Rh/(Co/Pt)m/CoFeB. The expression (Co/Pt)n means that the two-layer structure Co/Pt is stacked n times, and (Co/Pt)m means that the two-layer structure Co/Pt is stacked m times.

An antiferromagnetic layer is preferably disposed near the multilayer structure. The antiferromagnetic layer may include Fe—Mn, Pt—Mn, Pt—Cr—Mn, Ni—Mn, Ir—Mn, NiO, or $Fe_2O_3$. With the aforementioned structure, the magnetization of the reference layer is stably fixed without being influenced by the current magnetic field from a bit line or a word line.

The stray field from the reference layer may be reduced (or adjusted) and the shift of the magnetization in the storage layer may be adjusted by changing the thickness of the two ferromagnetic layers included in the reference layer. The magnetic layer (the reference layer) need to be thick enough not to enter the superparamagnetic state, and therefore preferably have a thickness of 0.4 nm or more.

A nonmagnetic insulating material or a nonmagnetic metal is used to form the nonmagnetic layer 22 of the magnetoresistive element 20. The nonmagnetic insulating material is preferably an oxide such as AlOx, MgO, Mg—AlOx, or Mg—ZnOx. The composition does not need to be completely accurate from the stoichiometric point of view. For example, oxygen or nitrogen may further be added or removed. The nonmagnetic layer 22 is preferably as thin as possible to allow the tunneling current to flow. The nonmagnetic metal may be Cu, Ag, or Au.

(Second Embodiment)

Figure 7:
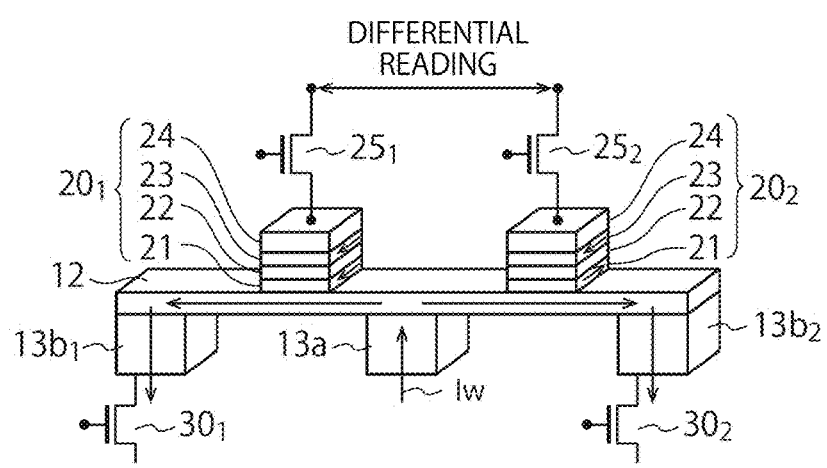
FIG. 7 is a perspective view of a memory cell included in a magnetic memory according to a second embodiment.

A magnetic memory according to a second embodiment will be described with reference to FIG. 7. The magnetic memory according to the second embodiment includes at least one memory cell, which is shown in FIG. 7. The memory cell includes a conductive layer 12, terminals $13a$, $13b_1$, and $13b_2$, magnetoresistive elements $20_1$ and $20_2$, switches $25_1$ and $25_2$, and switches $30_1$ and $30_2$.

The conductive layer 12 includes the same material as the conductive layer $12a$ of the first embodiment. The conductive layer 12 thus includes any of Ir—Ta, Ir—V, Au—V, Au—Nb, and Pt—V having the face-centered cubic (fcc) structure, or at least two of the above alloys that are combined to make an alloy. The conductive layer including such a material reduces the switching current Ic more than the conductive layer including a material other than the above materials, as in the case of the first embodiment. Like the first embodiment, the decrease in the switching current can be observed when the material of the conductive layer 12 is $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35). The materials $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), and $Pt_{1-x}V_x$ (x is from 0.05 to 0.35) have the fcc structure.

The terminals $13a$, $13b_1$, and $13b_2$ are disposed on the lower surface of the conductive layer 12. In FIG. 7, the terminal $13a$ is disposed between the terminal $13b_1$ and the terminal $13b_2$.

The magnetoresistive element $20_1$ is disposed on the conductive layer 12 between the terminal $13a$ and the terminal $13b_1$, and the magnetoresistive element $20_2$ is disposed on the conductive layer 12 between the terminal $13a$ and the terminal $13b_2$. The magnetoresistive element $20_i$ (i=1, 2) includes a storage layer 21 disposed on the conductive layer 12, a nonmagnetic insulating layer 22 disposed on the storage layer 21, a reference layer 23 disposed on the nonmagnetic layer insulating layer 22, and a cap layer 24 disposed on the reference layer 23. The magnetization direction of the storage layer 21 included in the magnetoresistive element $20_1$ and the magnetization direction of the storage layer 21 included in the magnetoresistive element element $20_2$ are opposite to each other.

A switch $25_i$ is connected to the cap layer 24 of the magnetoresistive element $20_i$ (i=1, 2). A switch $30_1$ is connected to the terminal $13b_1$, and a switch $30_2$ is connected to the terminal $13b_2$.

In the magnetic memory having the above-described structure, a write operation is performed by applying a voltage to the cap layers 24 of the magnetoresistive elements $20_1$ and $20_2$ via the switches $25_1$ and $25_2$ to change the magnetic anisotropy of the storage layer 21 of each of the magnetoresistive elements $20_1$ and $20_2$, and then turning on the switches $30_1$ an $30_2$ to cause a write current $I_w$ to flow from the terminal 13a to the terminal $13b_1$, and from the terminal 13a to the terminal $13b_2$. The direction of the write current flowing from the terminal 13a to the terminal $13b_1$ and the direction of the write current flowing from the terminal 13a to the terminal $13b_2$ are opposite to each other. Therefore, when a write operation is performed, the spin received by the storage layer of the magnetoresistive element $20_1$ from the conductive layer 12 is opposite to the spin received by the storage layer of the magnetoresistive element $20_2$ from the conductive layer 12.

In a read operation, the switches $30_1$ and $30_2$ are turned off and the switches $25_1$ and $25_2$ are turned on, a read current is caused to flow from the terminal 13a to the magnetoresistive element $20_1$ and to the magnetoresistive element $20_2$, and differential reading is performed by using outputs from the switches $25_1$ and $25_2$. A high-speed read operation can be performed in this manner.

The magnetic memory according to the second embodiment has a high-speed voltage control spintronic memory (VoCSM) architecture in which two magnetoresistive elements serve as one bit. The read operation of this memory is performed at a high speed by differentially reading data stored in the two magnetoresistive elements, and the write operation is performed with the magnetic anisotropy of the magnetoresistive element being reduced by a voltage effect to shorten the write time to $\frac{1}{10}$ (to improve the write speed) as compared with a magnetic memory with the same write current density.

Generally, a memory of differential type requires a current, the amount of which is twice the normally used amount, since the directions of magnetization of the storage layers included in the two magnetoresistive elements need to be switch at a time. If an alloy such as $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35), or an alloy obtained by combining at least two of these alloys is used to form the conductive layer 12 of the second embodiment, the write current density may be considerably reduced, and thus a high-speed VoCSM architecture with low power consumption may be obtained.

The magnetic memory according to the second embodiment improves the write efficiency, like the magnetic memory according to the first embodiment.

(Modification)

Figure 8:
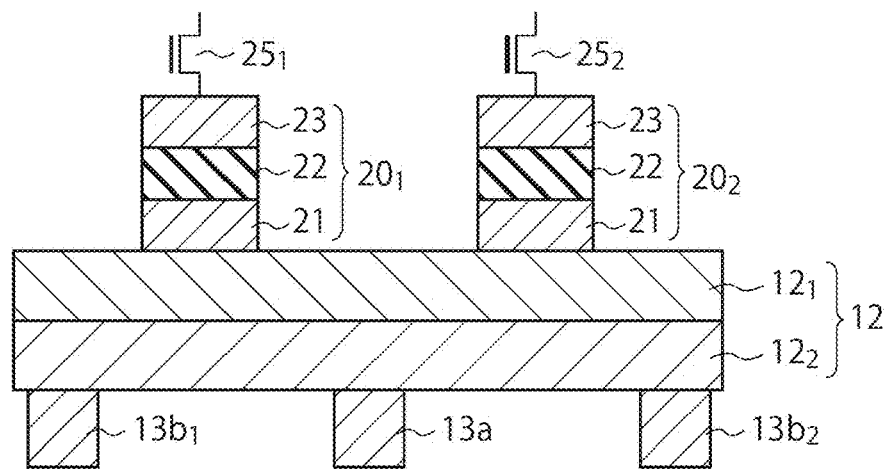
FIG. 8 is a cross-sectional view of a magnetic memory according to a modification of the second embodiment.

A magnetic memory according to a modification of the second embodiment will be described with reference to FIG. 8. The magnetic memory according to the modification has a configuration in which the conductive layer 12 of the magnetic memory according to the second embodiment shown in FIG. 7 has a two-layer structure as in the modification of the first embodiment shown in FIG. 5. The conductive layer 12 thus has a multilayer structure including a conductive layer $12_1$ and a conductive layer $12_2$ as shown in FIG. 8. The magnetoresistive elements $20_1$ and $20_2$ are disposed on the conductive layer $12_1$, and the terminals 13a, $13b_1$, and $13b_2$ are connected to the conductive layer $12_2$.

The terminals 13a, $13b_1$, and $13b_2$ may be connected to the conductive layer $12_1$. As in the first embodiment, a decrease in write current is observed if the conductive layer $12_1$ is $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35). The material may be one of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35), or an alloy obtained by combining at least two of the above alloys.

A sample is prepared, in which the conductive layer 12 has a two-layer structure including a Ta layer $12_2$ having a thickness of 5 nm, and a $Au_{90}V_{10}$ layer $12_1$ having a thickness of t nm, and an in-plane magnetization MTJ element having a structure CoFeB (2 nm)/MgO (1.5 nm)/CoFeB (1.2 nm)/Co (0.6 nm)/Ru (0.9 nm)/CoFe (1.8 nm)/IrMn (8 nm)/Ta(5 nm) is disposed on the layer $12_1$. The storage layer 21 is a CoFeB layer having a thickness of 2 nm, the nonmagnetic insulating layer 22 is a MgO layer having a thickness of 1.5 nm, and the reference layer 23 has a multilayer structure including a CoFeB layer having a thickness of 1.2 nm, a Co layer having a thickness of 0.6 nm, a Ru layer having a thickness of 0.9 nm, and a CoFe layer having a thickness of 1.8 nm. An IrMn layer having a thickness of 8 nm is disposed on the reference layer 23, and a Ta layer having a thickness of 5 nm is disposed on the IrMn layer.

Figure 9:
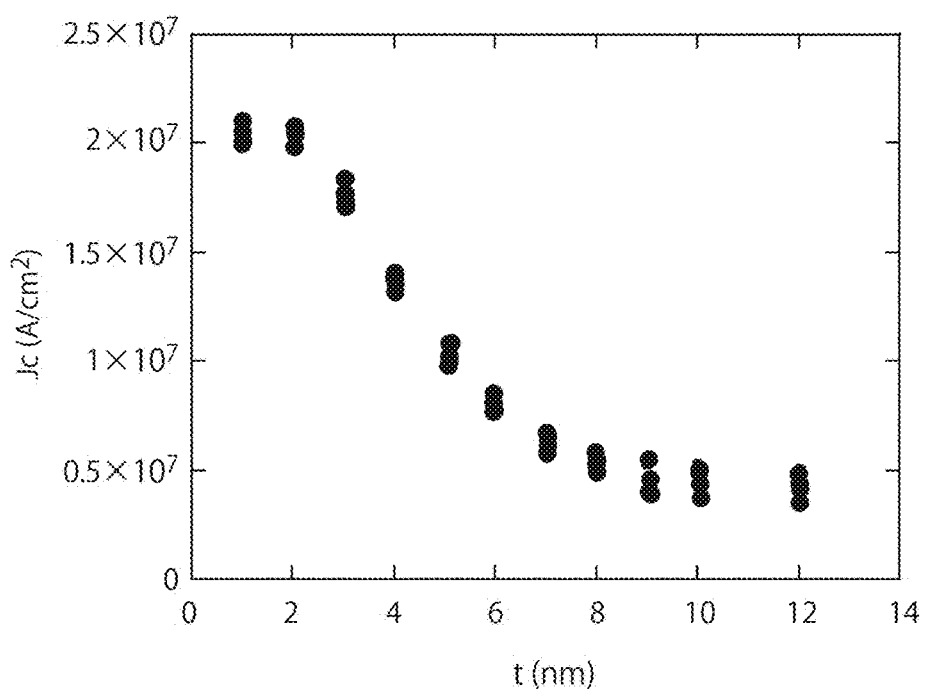
FIG. 9 is a diagram showing the result of measurements of switching current density Jc in the magnetic memory according to the modification of the second embodiment.

FIG. 9 shows the result of measurements of switching current density Jc relating to an SOT current for switching the magnetization of the storage layer 21 included in the magnetoresistive element 20 of the sample, when the thickness t (nm) of the $Au_{90}V_{10}$ layer $12_1$ is changed in a range from 1 nm to 12 nm. As can be understood from FIG. 9, the switching current density Jc decreases if the thickness t of the $Au_{90}V_{10}$ layer is greater than 3 nm, and further decreases if the thickness is greater than 5 nm.

The decrease in the switching current can also be observed when the material of the conductive layer $12_1$ is $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35). The tendency shown in FIG. 9 may also be observed when a material obtained by combining at least two of the above alloys is used for the conductive layer $12_1$.

The magnetic memory according to the modification also decreases the write current and the power consumption. Furthermore, the magnetic memory according to the modification improves the write efficiency, like the second embodiment.

The magnetic material of the storage layer 21 and the reference layer 23 in the second embodiment and its modification is not limited, but preferably at least one selected from Ni—Fe alloy, Co—Fe alloy, Co—Fe—Ni alloy, an amorphous material such as (Co, Fe)—(B), (Co, Fe, Ni)—(B), (Co, Fe, Ni)—(B)—(P, Al, Mo, Nb, Mn) or Co—(Zr, Hf, Nb, Ta, Ti), or a Heusler material such as Co—Fe—Al, Co—Fe—Si, Co—Mn—Si, or Co—Mn—Al. More preferably, the storage layer 21 and the reference layer 23 have a multilayer structure.

If the memory elements are densely disposed with intervals of 30 nm or less, the storage layer 21 preferably has a multilayer structure.

If this multilayer structure is used for a magnetic memory according to a third embodiment, which is described below, the margin for preventing erroneous writing is increased by applying a voltage to magnetoresistive elements serving as a plurality of bits disposed on an SO layer, causing a current to flow through the SO layer, and switching the magnetization of only the storage layers of the magnetoresistive elements to which the voltage is applied. The margin can be further increased by changing the sign of voltage applied to the magnetoresistive elements, and switching the magnetization of the storage layers included in the magnetoresistive elements to which the negative voltage is applied. If the storage layers have a multilayer structure described above, the margin is increased further.

(Third Embodiment)

Figure 10:
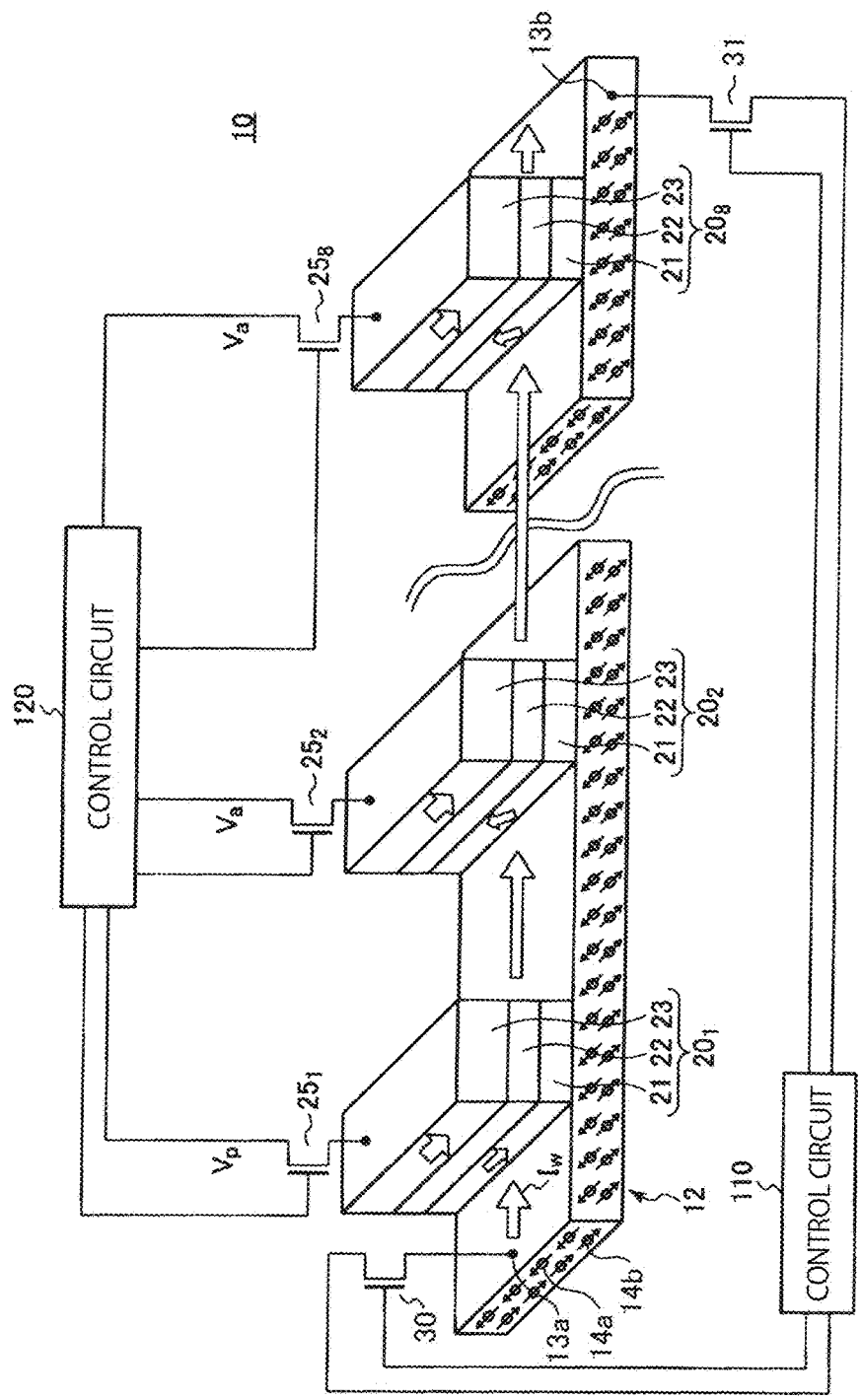
FIG. 10 is a perspective view of a memory cell included in a magnetic memory according to a third embodiment.

A magnetic memory according to the third embodiment is shown in FIG. 10. The magnetic memory according to the third embodiment is described with reference to FIGS. 10 to 12. The magnetic memory according to this embodiment includes at least one memory cell, the configuration of which is shown in FIG. 10.

The memory cell 10 includes a conductive layer 12, a plurality (for example eight) of magnetoresistive elements $20_1$ to $20_8$ disposed on one surface of the conductive layer 12 to be separate from one another, transistors $25_i$ each corresponding to one of the magnetoresistive elements $20_i$ (i=1, ..., 8), transistors 30 and 31 for causing a current to flow through the conductive layer 12, and control circuits 110 and 120.

The material of the conductive layer 12 is any of Ir—Ta, Ir—V, Au—V, Au—Nb, and Pt—V having the face-centered cubic (fcc) structure, or an alloy obtained by combining at least two of these alloys. Like the first embodiment, the use of such a material to form the conductive layer may lead to a decrease in the switching current Ic as compared to the case where a material other than the above materials is used for the conductive layer.

Like the first embodiment, the decrease in the switching current can be observed if the material of the conductive layer is $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35). Each of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), and $Pt_{1-x}V_x$ (x is from 0.05 to 0.35) has the fcc structure. The write current $I_w$ flows through the conductive layer 12.

The direction of current flowing through the conductive layer 12 is controlled by the control circuit 110. When the current flows, electrons 14a with up spin and electrons 14b with down spin flow through the conductive layer 12. The directions of the spins of the electrons 14a and 14b are indicated by arrows.

Each magnetoresistive element $20_i$ (1=1, ..., 8) has a multilayer structure including a storage layer 21 disposed on the conductive layer 12, a nonmagnetic layer 22 disposed on the storage layer 21, and the reference layer 23 disposed on the nonmagnetic layer 22. The magnetoresistive element $20_i$ (i=1, ..., 8) may be either a magnetic tunnel junction (MTJ) element in which the nonmagnetic layer 22 is an insulating layer, or a giant magneto-resistive (GMR) element in which the nonmagnetic layer 22 is a nonmagnetic metal layer. If the magnetoresistive element is an MTJ element of in-plane magnetization type, in which the magnetization directions of the storage layer 21 and the reference layer 23 are parallel to the film plane, and perpendicular to the layer-stacking direction of the multilayer structure, a CoFeB layer, for example, is used as the storage layer 21, a MgO layer, for example, is used as the nonmagnetic layer 22, and a synthetic antiferromagnetic multilayer structure is used as the reference layer, which includes, for example, a CoFeB layer, a Ru layer disposed on the CoFeB layer, and a CoFe layer disposed on the Ru layer, the CoFeB layer and the CoFe layer being coupled by antiferromagnetic coupling via the Ru layer. In the in-plane magnetization MTJ element, an antiferromagnetic layer of IrMn, for example, is disposed on the reference layer 23 in order to fix the magnetization of the reference layer 23. Although the magnetoresistive elements $20_1$ to $20_8$ are disposed on the conductive layer 12 in FIG. 10, they may be disposed under the conductive layer 12.

The MTJ element is patterned to have a rectangular shape. The stable magnetization direction in the storage layer and the reference layer is along the long axes of these layers due to the shape magnetic anisotropy. The stable magnetization direction is indicated by arrows in FIG. 10. The stability is called "(long axis) uniaxial magnetic anisotropy." The uniaxial magnetic anisotropy is dependent on the aspect ratio of the rectangle, the thickness of the storage layer, and the magnetization of the magnetic layer, and the write current threshold value $I_{co}$, which is described later, is proportional to the uniaxial magnetic anisotropy. Each magnetoresistive element $20_i$ (i=1, ..., 8) is a 1-bit storage element, and the memory cell 10 is, for example, a 1-byte cell including 8 bits.

One (first terminal) of the source and the drain of each transistor $25_i$ (i=1, ..., 8) is electrically connected to the reference layer 23 of the corresponding magnetoresistive element $20_i$, the other (second terminal) is connected to a selection line (not shown) for selecting the memory cell, and the gate (control terminal) is connected to a selection line (not shown) for selecting the corresponding magnetoresistive element $20_i$. Therefore, each transistor $25_i$ (i=1, ..., 8) is also called a bit selection transistor for selecting the corresponding magnetoresistive element $20_i$. Each magnetoresistive element $20_i$ (i=1, ..., 8) has a first terminal and a second terminal, the first terminal being connected to the conductive layer 12, and the second terminal being connected to the first terminal of the bit selection transistor $25_i$. The gate (control terminal) and the second terminal of each of the bit selection transistors $25_1$ to $25_8$ is connected to the control circuit 120 so that the ON state and the OFF state of each bit selection transistor is controlled by the control circuit 120 and the potential applied to the second terminal of each of the magnetoresistive elements $20_1$ to $20_8$ is controlled.

One (first terminal) of the source and the drain of the transistor 30 is connected to the terminal 13a, which is one of the two terminals 13a and 13b of the conductive layer 12, the other (second terminal) is connected to a power supply or a current source, and the gate (control terminal) receives a signal for selecting the memory cell 10. One (first terminal) of the source and the drain of the transistor 31 is connected to the terminal 13b, which is the other of the two terminals 13a and 13b of the conductive layer 12, the other (second terminal) is connected to a power supply or a current source, and the gate (control terminal) receives a signal for selecting the memory cell 10. A write operation to write data to the storage layer 21 of each magnetoresistive element $20_i$ (1=1, ..., 8) is performed by causing a write current to flow between the transistors 30 and 31 through the conductive layer 12. The transistors 30 and 31 are also called "byte selection transistors." The gate of each of the byte selection transistors 30 and 31 is connected to the control circuit 110 so that the ON state and the OFF state of the byte selection transistors 30 and 31 are controlled. The direction of the current flowing through the conductive layer 12 is also controlled by the control circuit 110. The transistor 31 may be eliminated, and the second terminal 13b of the conductive layer 12 may be grounded.

In the following descriptions, each magnetoresistive element $20_i$ (i=1, ..., 8) is assumed to be an MTJ element. The nonmagnetic layer 22 of each MTJ element, which is a MgO layer for example, is thick enough (for example, about 2 nm) to restrict the tunneling current flowing through the nonmagnetic layer 22 to be 1 µA or less. Therefore, when the control circuit 120 turns on the bit selection transistor $25_i$ (i=1, ..., 8), a voltage of about 0.5 V may be applied to the storage layer 21.

When the voltage is applied to the storage layer of the MTJ element, perpendicular magnetic anisotropy is induced to provide a vertical component to the magnetization of the storage layer. As a result, the stability of the magnetization (uniaxial magnetic anisotropy) is weakened. Thus, when the bit selection transistor $25_i$ (i=1, ..., 8) is in the ON state, the write current threshold value $I_{co}$ of the corresponding bit can be reduced. This state is called "bit half-selection state," and the write current threshold value in this state is set to be $I_{ch}$. In this embodiment, parameters of the layers such as the storage layer 21 are set so that the following formula, for example, holds:

$$I_{ch} \approx I_{co}/2 \quad (1)$$

The conductive layer 12 includes a material having a large spin Hall effect or a large Rashba effect that provides the spin orbit coupling function. The conductive layer 12 is disposed under the MTJ element and electrically connecting adjacent MTJ elements in series. Typically, MTJ elements of 1 byte (eight) are connected in series. The thickness of the conductive layer 12 is generally about 10 nm, and the sheet resistance of the conductive layer 12 is as low as about 1000Ω. This allows the eight (1 byte) MTJ elements to be connected in series. The series resistance of the MTJ elements is about 10 kΩ, which is substantially the same as that of a minute transistor. Therefore, a required write current may be provided.

When the byte selection transistors 30 and 31 are turned on by the control circuit 110, a write current $I_w$ flows through the conductive layer 12. In the memory cell 10 shown in FIG. 10, spin-polarized electrons with spin directed from the near side to the far side in the drawing are accumulated around the top surface of the conductive layer 12, and spin-polarized electrons 13a, 13b with spin directed from the far side to the near side in the drawing are accumulated near the lower surface of the conductive layer 12 due to the electron scattering caused by the spin orbit coupling in the conductive layer 12.

When a bit is selected in the memory cell 10 having the above-described configuration, data may be written to the bit due to the spin transfer torque caused by the accumulated spin-polarized electrons and the magnetization of the storage layer 21 when the write current $I_W$ exceeds the threshold current $I_{c0}$.

Similarly, when a bit is half-selected, data may be written to the bit due to the spin transfer torque caused by the accumulated spin-polarized electrons and the magnetization of the storage layer 21 when the write current $I_w$ exceeds the threshold current $I_{c0}/2$.

(Write Method)

Figure 11:
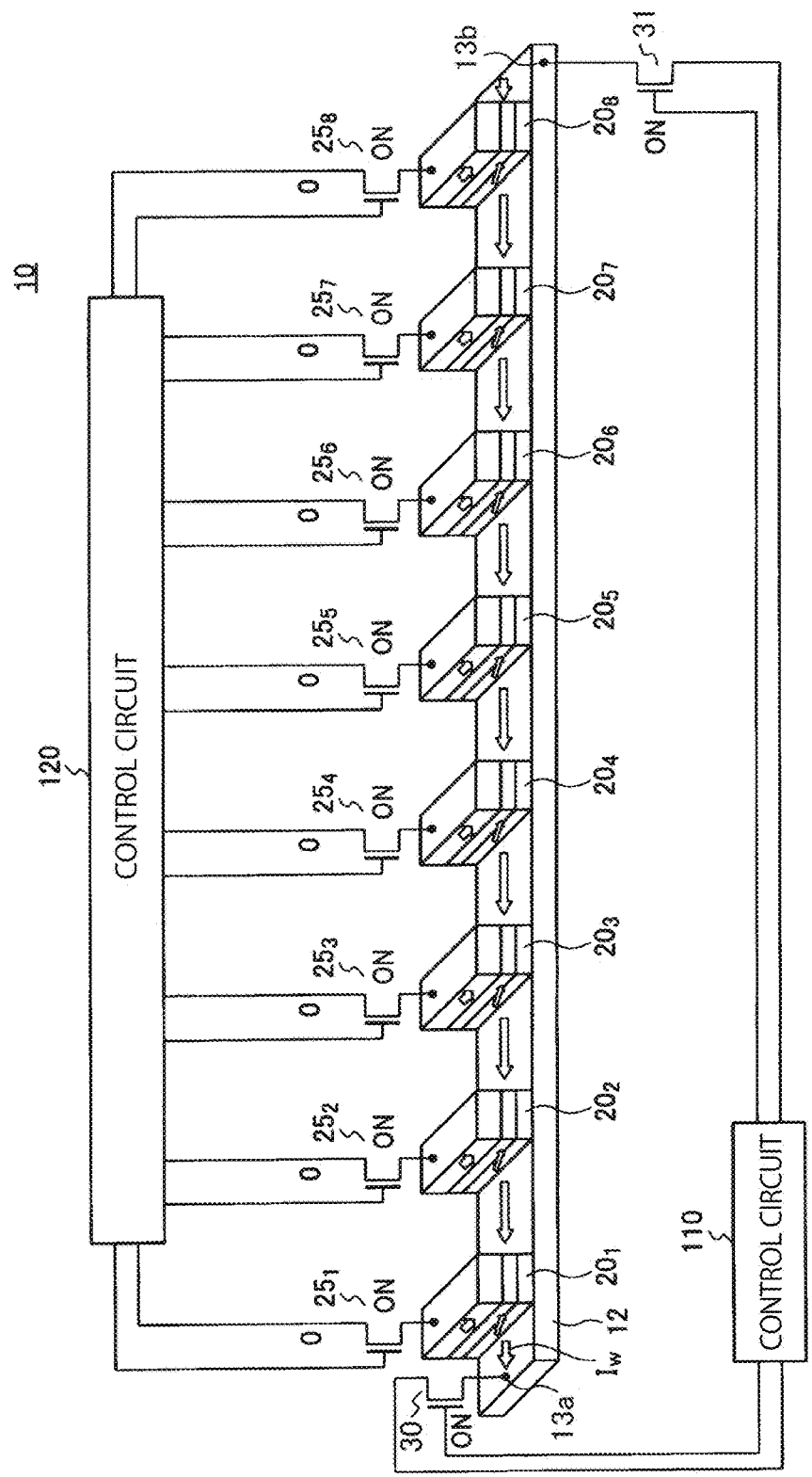
FIG. 11 is a diagram for explaining a write method of the magnetic memory according to the third embodiment.
Figure 12:
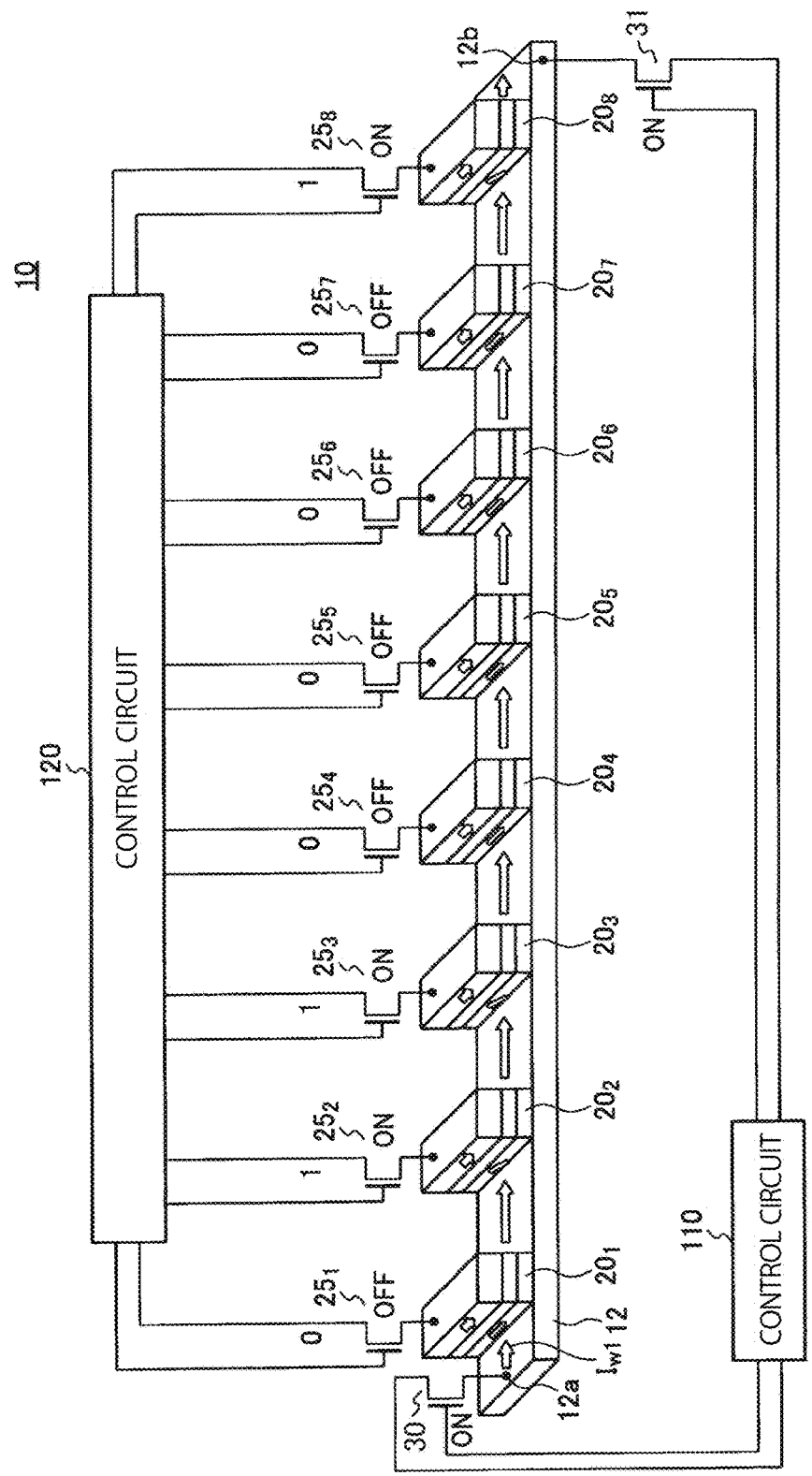
FIG. 12 is a diagram for explaining the write method of the magnetic memory according to the third embodiment.

A method of writing data to the memory cell 10 shown in FIG. 10 will be described below with reference to FIGS. 11 and 12. In this embodiment, a two-stage write operation is performed on the memory cell 10. FIGS. 11 and 12 show a case where 1-byte data (0, 1, 1, 0, 0, 0, 0, 1) is written to the memory cell 10.

First, as shown in FIG. 11, the byte selection transistors 30 and 31 and the bit selection transistors $25_1$ to $25_8$ are turned on by means of the control circuit 110 and the control circuit 120, and a first potential (for example, a positive potential) is applied to the reference layers 23 of the MTJ elements $20_1$ to $20_8$, and a write current $I_w$ is caused to flow between the first terminal 13a and the second terminal 13b of the conductive layer 12. At this time, the magnetization stability (uniaxial magnetic anisotropy) of the storage layers 21 in all of the MTJ elements $20_1$ to $20_8$ is weakened, and therefore the threshold current of the storage layers 21 is changed from $I_{c0}$ to $I_{ch}$, and data "0" is written to all of the MTJ elements $20_1$ to $20_8$, like (0, 0, 0, 0, 0, 0, 0, 0), by a write current $I_{w0}$ ($I_w > I_{w0} > I_{ch}$). The write error rate may be reduced to about $10^{-11}$ if the write current is about 1.5 times the threshold current. Therefore, the following formula holds:

$$I_{w0} \approx 1.5 I_{ch} \quad (2)$$

Next, the bit selection transistors connected to bits to which "1" is to be written, for example the bit selection transistors $25_2$, $25_3$, and $25_8$, are turned on by means of the control circuit 120, and a second potential (for example a negative potential) is applied to the reference layers 23 of the MTJ elements $20_2$, $20_3$, and $20_8$. A positive potential is preferably applied to the other MTJ elements $20_1$, $20_4$, $20_5$, $20_6$, and $20_7$ to reduce the error rate. The byte selection transistors 30 and 31 are also turned on by means of the control circuit 110 to cause a write current $I_{w1}$ ($I_{c0} > I_{w1} > I_{ch}$) to flow through the conductive layer 12 in a direction opposite to the direction for writing the data "0." As a result, data "1" is written to the storage layer 21 of each of the MTJ elements $20_2$, $20_3$, and $25_8$ (FIG. 12). At this time, the formula holds, as in the aforementioned case:

$$I_{w1} \approx 1.5 I_{ch} \quad (3)$$

Thus, 1-byte data (0, 1, 1, 0, 0, 0, 0, 1) can be written by the two-stage write operation. The two-stage write operation is made possible by the cooperation of the control circuit 110 and the control circuit 120. A first write circuit used in the first-stage write operation and a second write circuit used in the second-stage write operation in the two-stage write operation are connected to the control circuit 110 and the control circuit 120.

A read operation is performed in the following manner. When data is read from the memory cell 10, the byte selection transistors 30 and 31 and the bit selection transistors $25_1$ to $25_8$ of the memory cell 10 are turned on to select bits from which data is read. The resistance of each of the selected bits is measured using a current flowing between the selection transistor connected to the selected bit and one of the byte selection transistors, and type of data is determined based on the measured resistance.

In the foregoing and the following embodiments, MTJ elements with in-plane magnetization are described. However, the magnetoresistive elements are not limited to this type, but MTJ elements with perpendicular magnetization, for example, may also be used. As in the case of the MTJ elements with in-plane magnetization, the bit selection transistors are turned on, and bits are selected by decreasing or increasing the write threshold current.

As described above, in the memory cell according to the third embodiment, an alloy having the face-centered cubic (fcc) structure such as Ir—Ta, Ir—V, Au—V, Au—Nb, or Pt—V, or an alloy obtained by two or more of the above alloys is used as the material of the conductive layer 12. By using such a material to form the conductive layer, the switching current Ic may be decreased as compared to the case where a material other than the above-described materials are used to form the conductive layer, as in the case of the first embodiment.

Figure 13:
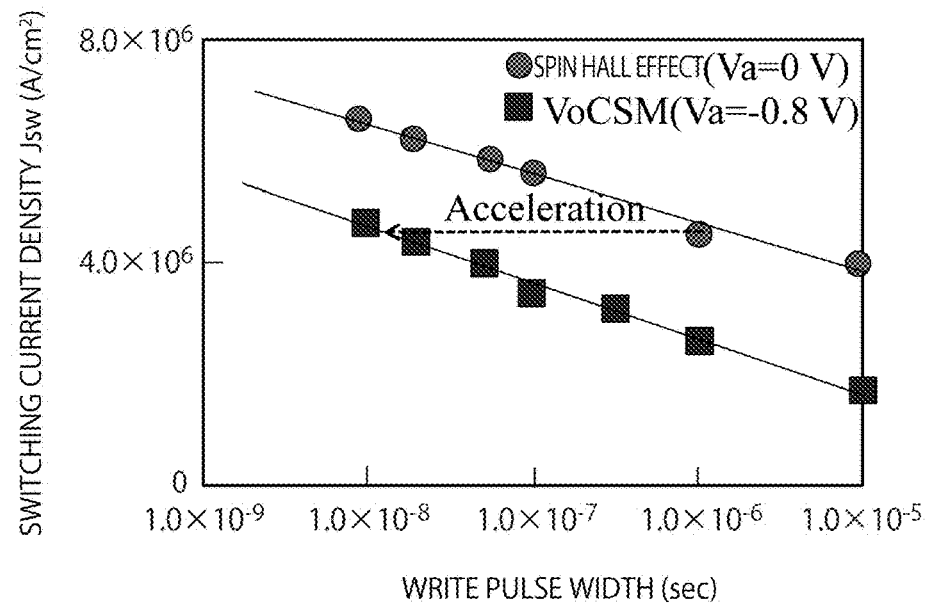
FIG. 13 is a diagram for explaining the effect of the magnetic memory according to the third embodiment.

FIG. 13 shows a result of measurements of the current density Jsw, at which the magnetization of the storage layer is switched, when a write operation is performed by applying a voltage to the reference layer of one of the magnetoresistive elements included in the memory cell 10 according to the third embodiment (VoCSM), and when a write operation is performed only by causing a current to flow through the conductive layer 12 without applying a voltage to the MTJ element. As can be understood from FIG. 13, the write speed in the case where the magnetic anisotropy of the magnetoresistive element is reduced by the voltage (VoCSM) is higher than the write speed in the write operation using the spin Hall effect, when the write current density is the same.

A voltage may be applied to the reference layer of the magnetoresistive element also in the first embodiment, the second embodiment, and their modifications.

The magnetic memory according to the third embodiment improves the write efficiency, like the magnetic memory according to the first embodiment.

(Modification)

A magnetic memory according to a modification of the third embodiment will be described below. The magnetic memory according to the modification has a structure in which the conductive layer 12 of the magnetic memory according to the third embodiment shown in FIG. 10 has two layers, like the modification of the first embodiment shown in FIG. 5. The conductive layer 12 has a multilayer structure including a first conductive layer and a second conductive layer, and the magnetoresistive elements $20_1$ to $20_8$ are disposed on the first conductive layer. The material of the first conductive layer is the same as the conductive layer 12, i.e., any of Ir—Ta, Ir—V, Au—V, Au—Nb or Pt—V having the fcc structure, or an alloy obtained by combining at least two of the above alloys. The material of the second conductive layer is a well-known SO-layer material such as Ta or W.

Figure 14:
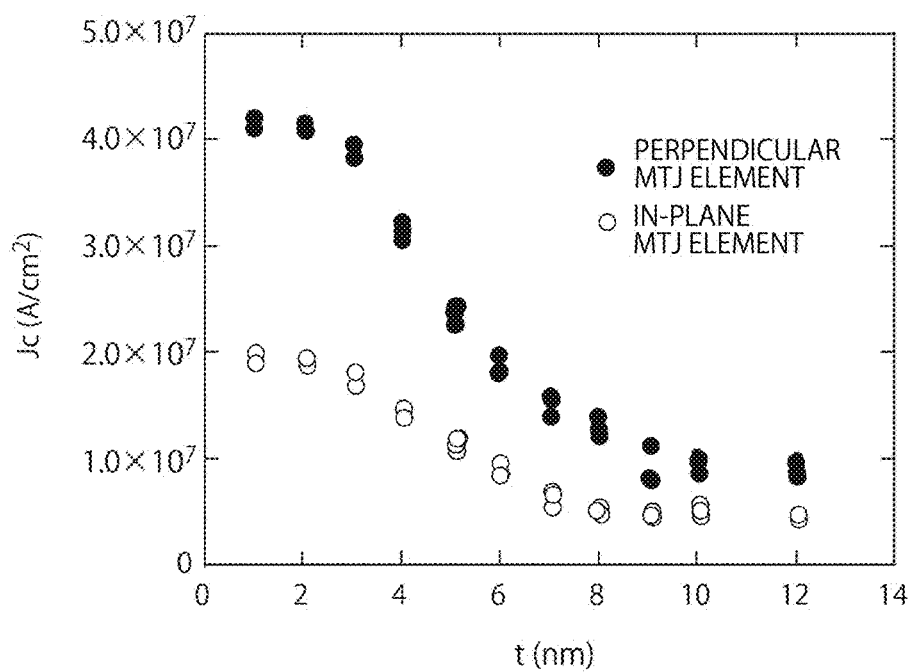
FIG. 14 is a diagram for explaining the effect of a magnetic memory according to a modification of the third embodiment.

In the modification, the conductive layer 12 has a two-layer structure including a Ta layer having a thickness of 5 nm and a $Pt_{90}V_{10}$ layer having a thickness of t nm. An MTJ element with in-plane magnetization is formed on the conductive layer, the MTJ element having a multilayer structure expressed as CoFeB (2 nm)/MgO (1.5 nm)/CoFeB (1.2 nm)/Co (0.6 nm)/Ru (0.9 nm)/CoFe (1.2 nm)/IrMn (8 nm)/Ta (5 nm). Thus, the MTJ element has a multilayer structure including a CoFeB layer having a thickness of 2 nm, an MgO layer having a thickness of 1.5 nm, a CoFeB layer having a thickness of 1.2 nm, a Co layer having a thickness of 0.6 nm, a Ru layer having a thickness of 0.9 nm, a CoFe layer having a thickness of 1.8 nm, a IrMn layer having a thickness of 8 nm, and a Ta layer having a thickness of 5 nm, the layers being stacked in this order. A sample is prepared, in which an MTJ element with perpendicular magnetization having a multilayer structure expressed as (Co (0.4 nm)/Pt (0.4 nm))n/CoFeB (1.0 nm)/MgO (1.5 nm)/CoFeB (1.0 nm)/Ta (0.5 nm)/(Co (0.4 nm)/Pt (0.6 nm))m/Ir (0.5 nm)/(Co (0.4 nm)/Pt (0.6 nm))k is formed on the same conductive layer. FIG. 14 shows a result of measurements of the switching current density Jc relating to the SOT current for the MTJ elements with in-plane magnetization and the MTJ element with perpendicular magnetization when the thickness t of the $Pt_{90}V_{10}$ layer in the conductive layer is changed to 1 nm, 2 nm, 3 nm, 4 nm, 5 nm, 6 nm, 7 nm, 8 nm, 9 nm, 10 nm, and nm. In the measurements of the MTJ element with perpendicular magnetization, an in-plane magnetic field $H_{ex}$=100 Oe is applied to perform the switching by using the SOT.

A voltage of 1 V is applied to the MTJ elements of both types in order to reduce the switching current by the voltage controlled magnetic anisotropy effect. As can be understood from FIG. 14, the switching current Jc decreases when the thickness t is 3 nm or more, more preferably 5 nm or more.

The decrease in the switching current is also observed when the material of the first conductive layer is $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35). A material obtained by combining at least two of the above alloys may also be used to form the first conductive layer to have a similar effect to FIG. 14.

The magnetic memory according to the modification reduces the write current and the power consumption. Furthermore, the magnetic memory according to the modification improves the write efficiency, like the magnetic memory according to the third embodiment.

(Fourth Embodiment)

Figure 15:
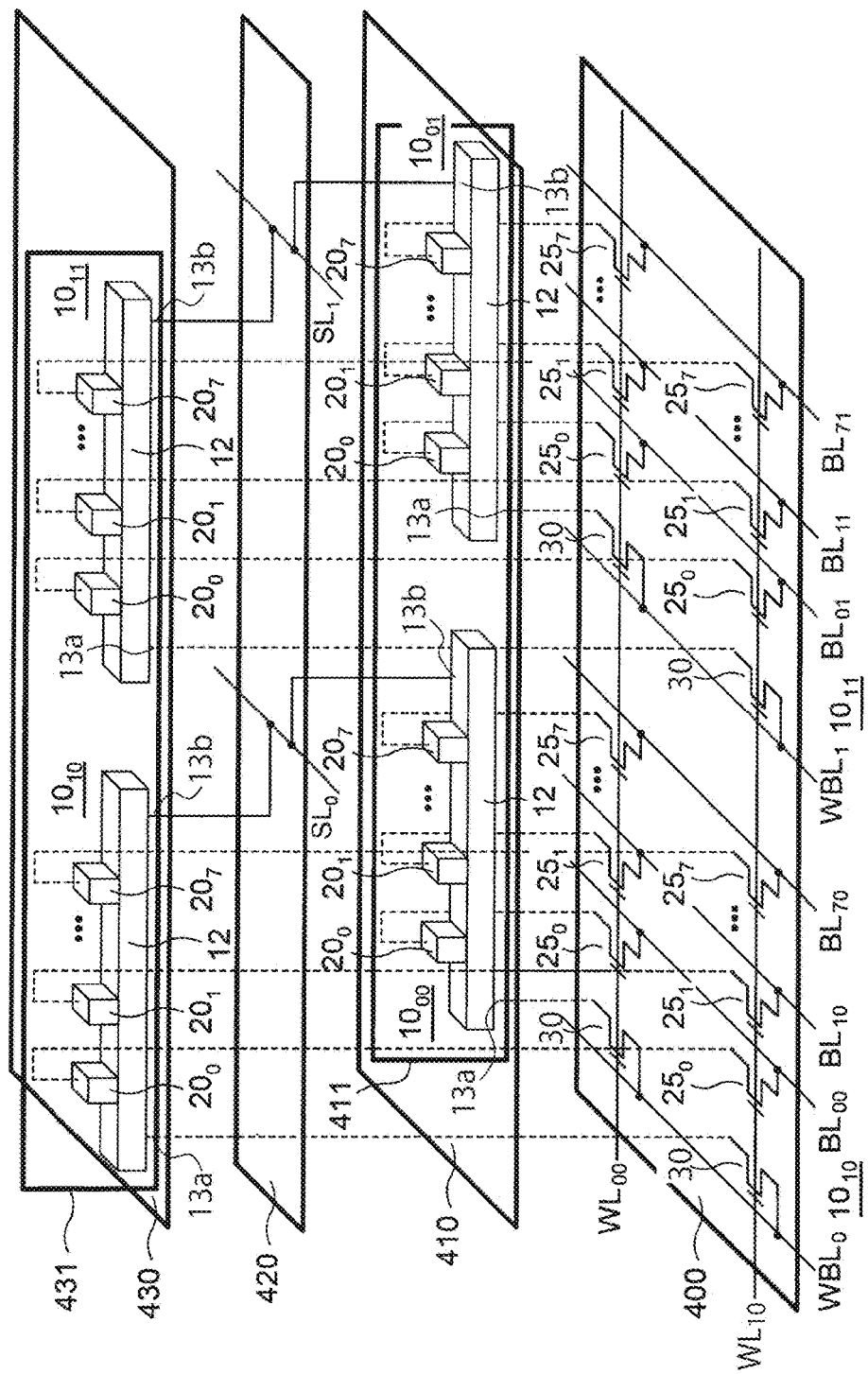
FIG. 15 is a perspective view of a magnetic memory according to a fourth embodiment.

A magnetic memory according to a fourth embodiment will be described below with reference to FIG. 15. As shown in FIG. 15, the magnetic memory according to the fourth embodiment includes memory cells $10_{00}$, $10_{01}$, $10_{10}$, and $10_{11}$, word lines $WL_{00}$ and $WL_{10}$, bit lines $BL_{00}$ to $BL_{70}$ and $BL_{01}$ to $BL_{71}$, write bit lines $WBL_0$ and $WBL_1$, and source lines $SL_0$ and $SL_1$.

Each memory cell $10_{ij}$ (i, j=0, 1) includes a nonmagnetic conductive layer 12, memory elements (magnetoresistive elements) $20_0$ to $20_7$ disposed on the conductive layer 12, selection transistors $25_0$ to $25_7$, and a selection transistor 30. Each conductive layer 12 has a first terminal 13a and a second terminal 13b. Like the magnetic memory 10 according to the first embodiment shown in FIG. 4, each memory element $20_j$ (j=0 . . . , 7) has a multilayer structure including a storage layer 21, a nonmagnetic layer 22, and a reference layer 23.

The magnetic memory according to the fourth embodiment has first to fourth levels 400, 410, 420, and 430.

In the first level 400, the selection transistors $25_0$ to $25_7$ and the selection transistor 30 of each memory cell $10_{ij}$ (i, j=0, 1), the word lines $WL_{00}$ and $WL_{10}$, the write bit lines $WBL_0$ and $WBL_1$, and the bit lines $BL_{00}$ to $BL_{71}$ are disposed.

In the second level 410, vias and wiring lines connecting to the first level 400, and the memory elements $20_0$ to $20_7$ and the conductive layer 12 of each memory cell $10_{0j}$ (j=0, 1) are disposed. The solid line 411 indicates a region including the memory elements $20_0$ to $20_7$ and the conductive layers 12 of the memory cells $10_{00}$ and $10_{01}$.

In the third level 420, vias and wiring lines connecting to the second level 410 and the fourth level 430 and source lines $SL_0$ and $SL_1$ are disposed.

In the fourth level 430, vias and wiring lines connecting to the third level 420, and the memory elements $20_0$ to $20_7$ and the conductive layer 12 of each the memory cell $10_{1j}$ (j=0, 1) are disposed. The solid line 431 indicates a region including the memory elements $20_0$ to $20_7$ and the conductive layers 12 of the memory cells $10_{10}$ and $10_{11}$.

The selection transistors $25_0$ to $25_7$, the selection transistors 30, the word lines $WL_{00}$ and $WL_{10}$, the bit lines $BL_{00}$ to $BL_{70}$ and $BL_{01}$ to $BL_{71}$, and the write bit lines $WBL_0$ and $WBL_1$ are disposed in the first level 400.

The memory cells $10_{00}$ and $10_{01}$ are disposed in the second level 410. The source lines $SL_0$ and $SL_1$ are disposed in the third level 420. The memory cells $10_{10}$ and $10_{11}$ are disposed in the fourth level 430.

In each of the memory cells $10_{00}$ and $10_{10}$, the reference layer of the memory element $20_j$ (j=0, ..., 7) is connected to one of the source and the drain of the selection transistor $25_j$, and the other of the source and the drain of the selection transistor $25_j$ is connected to the bit line $BL_{j0}$.

In each of the memory cells $10_{01}$ and $10_{11}$, the reference layer of the memory element $20_j$ (j=0, ..., 7) is connected to one of the source and the drain of the selection transistor $25_j$, and the other of the source and the drain of the selection transistor $25_j$ is connected to the bit line $BL_{j1}$.

In each of the memory cells $10_{00}$ and $10_{10}$, the first terminal 13a is connected to one of the source and the drain of the selection transistor 30, and the other of the source and the drain of the selection transistor 30 is connected to the write bit line $WBL_0$. The second terminal 13b is connected to the source line $SL_0$.

In each of the memory cells $10_{01}$ and $10_{11}$, the first terminal 13a is connected to one of the source and the drain of the selection transistor 30, and the other of the source and the drain of the selection transistor 30 is connected to the write bit line $WBL_1$. The second terminal 13b is connected to the source line $SL_1$.

The write operation and the read operation performed on each memory cell $10_{ij}$ (i, j=0, 1) of the fourth embodiment having the above-described configuration are the same as those for the magnetic memory according to the third embodiment.

The material of each conductive layer 12 of the fourth embodiment is any of Ir—Ta, Ir—V, Au—V, Au—Nb, and Pt—V having the face-centered cubic (fcc) structure, or an alloy obtained by combining at least two of the above alloys. The conductive layer formed of any of the above-described materials may reduce the switching current Ic as compared to the conductive layer formed of a material other than the above-described materials, when the material of the storage layer 21 is the same (has the same $\Delta$).

The reduction in the switching current may also be observed when the material is any of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), and $Pt_{1-x}V_x$ (x is from 0.05 to 0.35). Each of the materials $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), and $Pt_{1-x}V_x$ (x is from 0.05 to 0.35) has the fcc structure.

As described above, the magnetic memory according to the fourth embodiment can improve the write efficiency, like the magnetic memory according to the third embodiment.

(Modification)

A magnetic memory according to a modification of the fourth embodiment has a configuration in which each of the conductive layers 12 in the magnetic memory according to the fourth embodiment has a multilayer structure including a first conductive layer and a second conductive layer, and the magnetoresistive elements $20_0$ to $20_7$ are disposed on the first conductive layer, like the modification of the third embodiment. The material of the first conductive layer is the same as that of the conductive layer 12, i.e., any of Ir—Ta, Ir—V, Au—V, Au—Nb, and Pt—V having the fcc structure, or an alloy obtained by combining at least two of the above alloys. The material of the second conductive layer is a well-known SO-layer material such as Ta or W.

The magnetic memory according to the modification improves the write efficiency, like the magnetic memory according to the fourth embodiment.

If the magnetoresistive elements are MTJ elements in the first to fourth embodiments and their modifications, the coercive force of the magnetization free layer in each MTJ element needs to be changed by a voltage. Therefore, it is undesirable that the nonmagnetic insulating layer 22 of each MTJ element has a very low resistance area product (RA). A preferable RA is several ten $\Omega^2$ to several thousand $K\Omega\mu m^2$. In this case, if the resistance is several thousand $K\Omega\mu m^2$, the switching in a write operation is mainly caused by a voltage and SOT, and if the resistance is several ten $\Omega\mu m^2$, the switching is mainly caused by a voltage, SOT, and STT.

The embodiments of the present invention have been described with reference to the specific examples. However, the present invention is not limited to the specific examples. For example, specific materials, thicknesses, and shapes, of dimensions of the SO layer, and the ferromagnetic material layers, insulating films, antiferromagnetic material layers, nonmagnetic metal layers, and electrodes that serve as the ferromagnetic tunnel junction elements, may be arbitrarily selected by those skilled in the art to carry out the present invention to have similar effects. Such elements and layers are also included in the scope of the present invention.

Similarly, the structure, the material, the shape, and the dimensions of each element included in the magnetic memory according to an embodiment of the present invention may be arbitrarily selected by those skilled in the art to carry out the present invention to have similar effects. Such elements are included in the scope of the present invention.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory comprising:
   a first terminal, a second terminal, and a third terminal;
   a nonmagnetic conductive layer including a first region, a second region, and a third region, the second region being disposed between the first region and the third region, the first region being electrically connected to the first terminal, and the third region being electrically connected to the second terminal; and
   a magnetoresistive element disposed to correspond to the second region, including a first magnetic layer electrically connected to the third terminal, a second magnetic layer disposed between the first magnetic layer and the second region, and a nonmagnetic layer disposed between the first magnetic layer and the second magnetic layer,
   the nonmagnetic conductive layer including at least one of an alloy including Ir and Ta, an alloy including Ir and V, an alloy including Au and V, an alloy including Au and Nb, or an alloy including Pt and V, each of the alloys having an fcc structure.

2. The magnetic memory according to claim 1, wherein the second region of the nonmagnetic conductive layer includes a first layer and a second layer, the first layer being disposed between the magnetoresistive element and the second layer, the first layer including at least one of the alloys and having a thickness of 3 nm or more.

3. The magnetic memory according to claim 1, wherein the nonmagnetic conductive layer includes at least one of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35).

4. The magnetic memory according to claim 1, wherein the nonmagnetic conductive layer includes a first layer and a second layer, the first layer being disposed on a side of the magnetoresistive element, the first layer including at least one of the alloys and having a thickness of 3 nm or more.

5. A magnetic memory comprising:
a first terminal, a second terminal, a third terminal, a fourth terminal, and a fifth terminal;
a nonmagnetic conductive layer including a first region, a second region, a third region, a fourth region, and a fifth region, the second region being disposed between the first region and the fifth region, the third region being disposed between the second region and the fifth region, the fourth region being disposed between the third region and the fifth region, the first region being electrically connected to the first terminal, the fifth region being electrically connected to the second terminal, and the third region being electrically connected to the third terminal;
a first magnetoresistive element disposed to correspond to the second region, including a first magnetic layer electrically connected to the fourth terminal, a second magnetic layer disposed between the first magnetic layer and the second region, and a first nonmagnetic layer disposed between the first magnetic layer and the second magnetic layer; and
a second magnetoresistive element disposed to correspond to the fourth region, including a third magnetic layer electrically connected to the fifth terminal, a fourth magnetic layer disposed between the third magnetic layer and the fourth region, and a second nonmagnetic layer disposed between the third magnetic layer and the fourth magnetic layer,
the nonmagnetic conductive layer including at least one of an alloy including Ir and Ta, an alloy including Ir and V, an alloy including Au and V, an alloy including Au and Nb, or an alloy including Pt and V, each of the alloys having an fcc structure.

6. The magnetic memory according to claim 5, wherein the second region of the nonmagnetic conductive layer includes a first layer and a second layer and the fourth region includes a third layer and a fourth layer, the first layer being disposed between the second magnetic layer and the second layer, the first layer including at least one of the alloys and having a thickness of 3 nm or more, the third layer being disposed between the fourth magnetic layer and the fourth layer, and the third layer including at least one of the alloys and having a thickness of 3 nm or more.

7. The magnetic memory according to claim 5, wherein the nonmagnetic conductive layer includes at least one of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35).

8. The magnetic memory according to claim 5, wherein the nonmagnetic conductive layer includes a first layer and a second layer, the first layer being disposed on a side of the first and second magnetoresistive elements, the first layer including at least one of the alloys and having a thickness of 3 nm or more.

9. A magnetic memory comprising:
a first terminal, a second terminal, a third terminal, and a fourth terminal;
a nonmagnetic conductive layer including a first region, a second region, a third region, and a fourth region, the second region being disposed between the first region and the fourth region, the third region being disposed between the second region and the fourth region, the first region being electrically connected to the first terminal, and the fourth region being electrically connected to the second terminal;
a first magnetoresistive element disposed to correspond to the second region, including a first magnetic layer electrically connected to the third terminal, a second magnetic layer disposed between the first magnetic layer and the second region, and a first nonmagnetic layer disposed between the first magnetic layer and the second magnetic layer; and
a second magnetoresistive element disposed to correspond to the third region, including a third magnetic layer electrically connected to the fourth terminal, a fourth magnetic layer disposed between the third magnetic layer and the third region, and a second nonmagnetic layer disposed between the third magnetic layer and the fourth magnetic layer,
the nonmagnetic conductive layer including at least one of an alloy including Ir and Ta, an alloy including Ir and V, an alloy including Au and V, an alloy including Au and Nb, or an alloy including Pt and V, each of the alloys having an fcc structure.

10. The magnetic memory according to claim 9, wherein the second region of the nonmagnetic conductive layer includes a first layer and a second layer, and the third region includes a third layer and a fourth layer, the first layer being disposed between the second magnetic layer and the second layer, the first layer including at least one of the alloys and having a thickness of 3 nm or more, the third layer being disposed between the fourth magnetic layer and the fourth layer, and the third layer including at least one of the alloys and having a thickness of 3 nm or more.

11. The magnetic memory according to claim 9, wherein the nonmagnetic conductive layer includes at least one of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35).

12. The magnetic memory according to claim 9, wherein the nonmagnetic conductive layer includes a first layer and a second layer, the first layer being disposed on a side of the first and second magnetoresistive elements, the first layer including at least one of the alloys and having a thickness of 3 nm or more.

13. A magnetic memory comprising:
a first wiring, a second wiring, a third wiring, a fourth wiring, and a fifth wiring;
a first terminal, a second terminal electrically connected to the fifth wiring, a third terminal, and a fourth terminal electrically connected to the fifth wiring;
a first conductive layer including a first region, a second region, and a third region, the second region being disposed between the first region and the third region, the first region being electrically connected to the first terminal, and the third region being electrically connected to the second terminal;
a second conductive layer including a fourth region, a fifth region, and a sixth region, the fifth region being disposed between the fourth region and the sixth region, the fourth region being electrically connected to the third terminal, and the sixth region being electrically connected to the fourth terminal;

a first magnetoresistive element disposed to correspond to the second region, including a first magnetic layer, a second magnetic layer disposed between the first magnetic layer and the second region, and a first nonmagnetic layer disposed between the first magnetic layer and the second magnetic layer;

a second magnetoresistive element disposed to correspond to the fifth region, including a third magnetic layer, a fourth magnetic layer disposed between the third magnetic layer and the fifth region, and a second nonmagnetic layer disposed between the third magnetic layer and the fourth magnetic layer;

a first transistor including a fifth terminal electrically connected to the first magnetic layer, a six terminal electrically connected to the third wiring, and a first control terminal electrically connected to the first wiring;

a second transistor including a seventh terminal electrically connected to the first terminal, an eighth terminal electrically connected to the second wiring, and a second control terminal electrically connected to the first wiring;

a third transistor including a ninth terminal electrically connected to the third magnetic layer, a tenth terminal electrically connected to the third wiring, and a third control terminal electrically connected to the fourth wiring; and a fourth transistor including an eleventh terminal electrically connected to the third terminal, a twelfth terminal electrically connected to the second wiring, and a fourth control terminal electrically connected to the fourth wiring, the first wiring, the second wiring, the third wiring, and the fourth wiring, and the first transistor, the second transistor, the third transistor, and the fourth transistor being disposed in a first level, the first conductive layer and the first magnetoresistive element being disposed in a second level that is above the first level, the fifth wiring being disposed in a third level that is above the second level, and the second conductive layer and the second magnetoresistive element being disposed in a fourth level that is above the third level, and the first conductive layer and the second conductive layer including at least one of an alloy including Ir and Ta, an alloy including Ir and V, an alloy including Au and V, an alloy including Au and Nb, or an alloy including Pt and V, each of the alloys having an fcc structure.

14. The magnetic memory according to claim 13, wherein:

the second region of the first conductive layer includes a first layer and a second layer, the first layer being disposed between the second magnetic layer and the second layer, the first layer including at least one of the alloys and having a thickness of 3 nm or more; and the fifth region of the second conductive layer includes a third layer and a fourth layer, the third layer being disposed between the fourth magnetic layer and the fourth layer, the third layer including at least one of the alloys and having a thickness of 3 nm or more.

15. The magnetic memory according to claim 13, wherein the first magnetoresistive element is disposed above the first conductive layer, and the second magnetoresistive element is disposed above the second conductive layer.

16. The magnetic memory according to claim 13, wherein the first conductive layer and the second conductive layer include at least one of $Ir_{1-x}Ta_x$ (x is from 0.05 to 0.4), $Ir_{1-x}V_x$ (x is from 0.05 to 0.35), $Au_{1-x}V_x$ (x is from 0.05 to 0.5), $Au_{1-x}Nb_x$ (x is from 0.05 to 0.35), or $Pt_{1-x}V_x$ (x is from 0.05 to 0.35).

17. The magnetic memory according to claim 13, wherein:

the first conductive layer includes a first layer and a second layer, the first layer being disposed on a side of the first magnetoresistive element, the first layer including at least one of the alloys and having a thickness of 3 nm or more, and the second conductive layer includes a third layer and a fourth layer, the third layer being disposed on a side of the second magnetoresistive element, the third layer including at least one of the alloys and having a thickness of 3 nm or more.

* * * * *